United States Patent
Wei et al.

(10) Patent No.: US 8,248,823 B2
(45) Date of Patent: Aug. 21, 2012

(54) CHIP CARD HOLDER

(75) Inventors: Xiao-Liang Wei, Shenzhen (CN); Wei-Hui Fan, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 242 days.

(21) Appl. No.: 12/781,943

(22) Filed: May 18, 2010

(65) Prior Publication Data

US 2011/0051391 A1    Mar. 3, 2011

(30) Foreign Application Priority Data

Aug. 31, 2009  (CN) .......................... 2009 1 0306381

(51) Int. Cl.
 *H05K 9/00* (2006.01)
(52) U.S. Cl. ....................................................... 361/818
(58) Field of Classification Search .................. 361/807, 361/810, 756, 727, 731, 818, 816; 439/945, 439/946
See application file for complete search history.

(56) References Cited

U.S. PATENT DOCUMENTS

| | | | | |
|---|---|---|---|---|
| 6,034,874 A | * | 3/2000 | Watanabe | 361/704 |
| 6,061,235 A | * | 5/2000 | Cromwell et al. | 361/690 |
| 6,084,178 A | * | 7/2000 | Cromwell | 174/383 |
| 6,128,194 A | * | 10/2000 | Francis | 361/737 |
| 6,264,506 B1 | * | 7/2001 | Yasufuku et al. | 439/638 |
| 6,334,786 B1 | * | 1/2002 | Lee | 439/331 |
| 6,597,582 B2 | * | 7/2003 | Baba | 361/760 |
| 6,673,998 B1 | * | 1/2004 | Wu | 174/383 |
| 6,717,818 B1 | * | 4/2004 | Lin | 361/753 |
| 7,659,606 B2 | * | 2/2010 | Klatt | 257/679 |
| 2003/0142485 A1 | * | 7/2003 | Szu | 361/816 |
| 2005/0281010 A1 | * | 12/2005 | Wang et al. | 361/752 |
| 2008/0151510 A1 | * | 6/2008 | Cho et al. | 361/727 |
| 2009/0201660 A1 | * | 8/2009 | Kim | 361/818 |
| 2009/0280670 A1 | * | 11/2009 | Feng | 439/326 |

* cited by examiner

*Primary Examiner* — Lisa Lea Edmonds
*Assistant Examiner* — Xanthia C Cunningham
(74) *Attorney, Agent, or Firm* — Altis Law Group, Inc.

(57) ABSTRACT

A chip card holder for holding a chip card is disclosed including a base member, a mounting frame and a holding member. The mounting frame is made of metal materials and secured to the base member. The holding member is used to hold the chip card and is slidably mounted within the mounting frame. When the holding member is completely received in the mounting frame, the mounting frame and the base member cooperatively enclose and preventing the chip card from electromagnetic interference.

14 Claims, 5 Drawing Sheets

CHIP CARD HOLDER

BACKGROUND

1. Technical Field

The exemplary disclosure relates to chip card holders used in portable electronic devices.

2. Description of Related Art

Portable electronic devices typically use chip cards holders for installing chip cards. The chip card holders usually include a holding frame mounted on the housing of the portable electronic device. The holding frame holds the chip card inside the electronic device, however, this type of frame can expose the chip card to other electronic components received in the electronic device. Accordingly, the chip card is subject to electromagnetic interferences from other electronic components.

Therefore, there is room for improvement within the art.

BRIEF DESCRIPTION OF THE DRAWINGS

Many aspects of the present chip card holder can be better understood with reference to the following drawings. The components in the various drawings are not necessarily drawn to scale, the emphasis instead being placed upon clearly illustrating the principles of the present disclosure. Moreover, in the drawings, like reference numerals designate corresponding parts throughout the diagrams.

DETAILED DESCRIPTION

Figure 1:
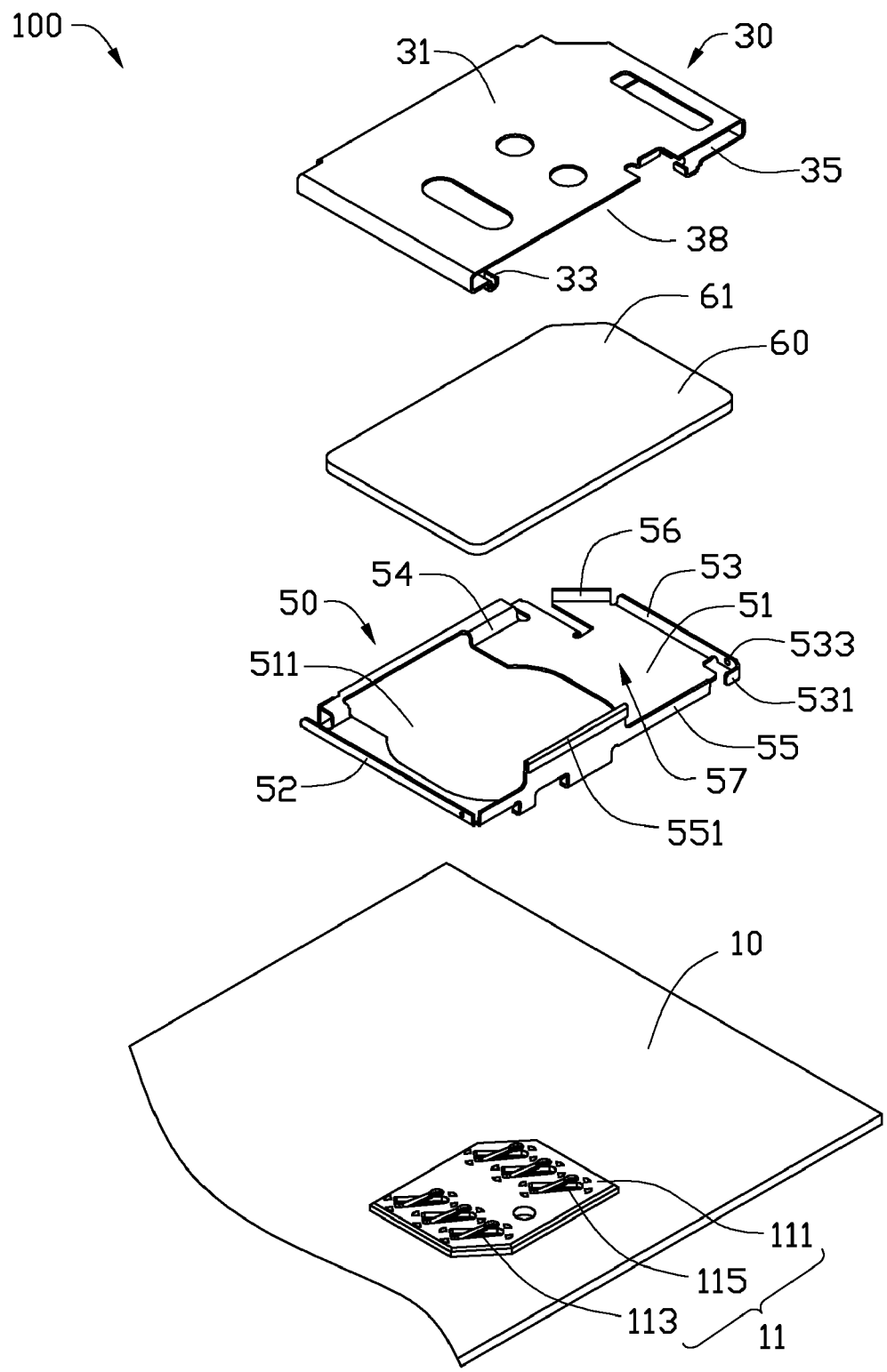
FIG. 1 is an exploded isometric view of an exemplary chip card holder including a mounting frame and a holding frame.
Figure 3:
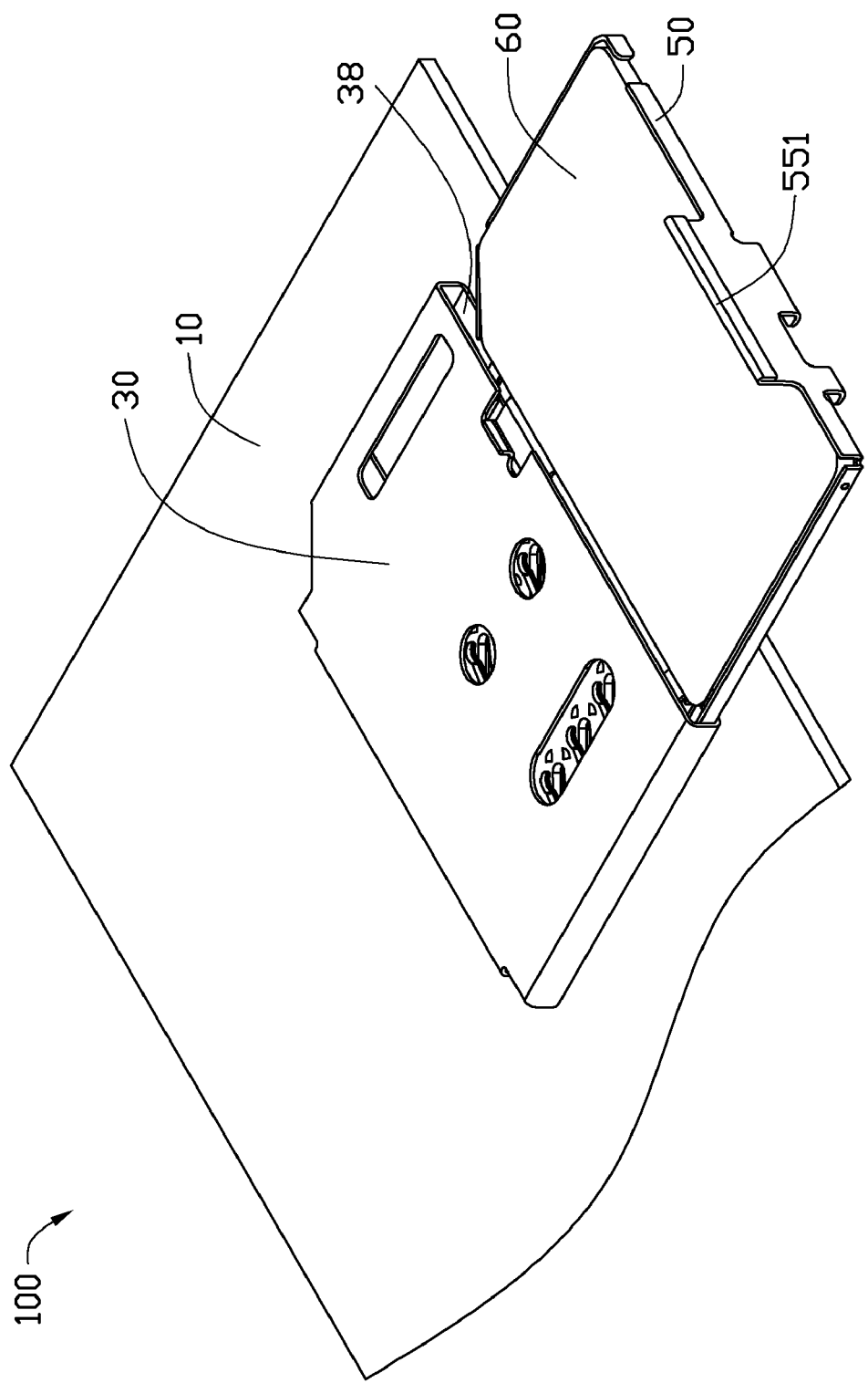
FIG. 3 is an assembled view of the chip card holder shown in FIG. 1 in an open position.

FIG. 1 and FIG. 3 show an exemplary chip card holder 100 applicable for holding various kinds of chip cards such as Secure Digital Card (SD card), Smart Media Card (SM card), and Subscriber Identity Module Card (SIM card) within a portable electronic device. The chip card holder 100 includes a base member 10, a mounting frame 30 and a holding member 50. The base member 10 is a circuit board mounted within the portable electronic device. The mounting frame 30 is mounted on the base member 10. The holding member 50 is slidably mounted on the mounting frame 30 for holding the chip card 60 having a corner portion 61.

The base member 10 has a connector 11 mounted thereon. The connector 11 includes a base block 111, a plurality of accommodating grooves 113 and a plurality of connector pins 115. The plurality of accommodating grooves 113 are recessed in the top wall of the base block 111. The connector pins 115 have an elasticity and are partially received in the accommodating grooves 113 with their distal ends extending out of the accommodating grooves 113.

Figure 2:
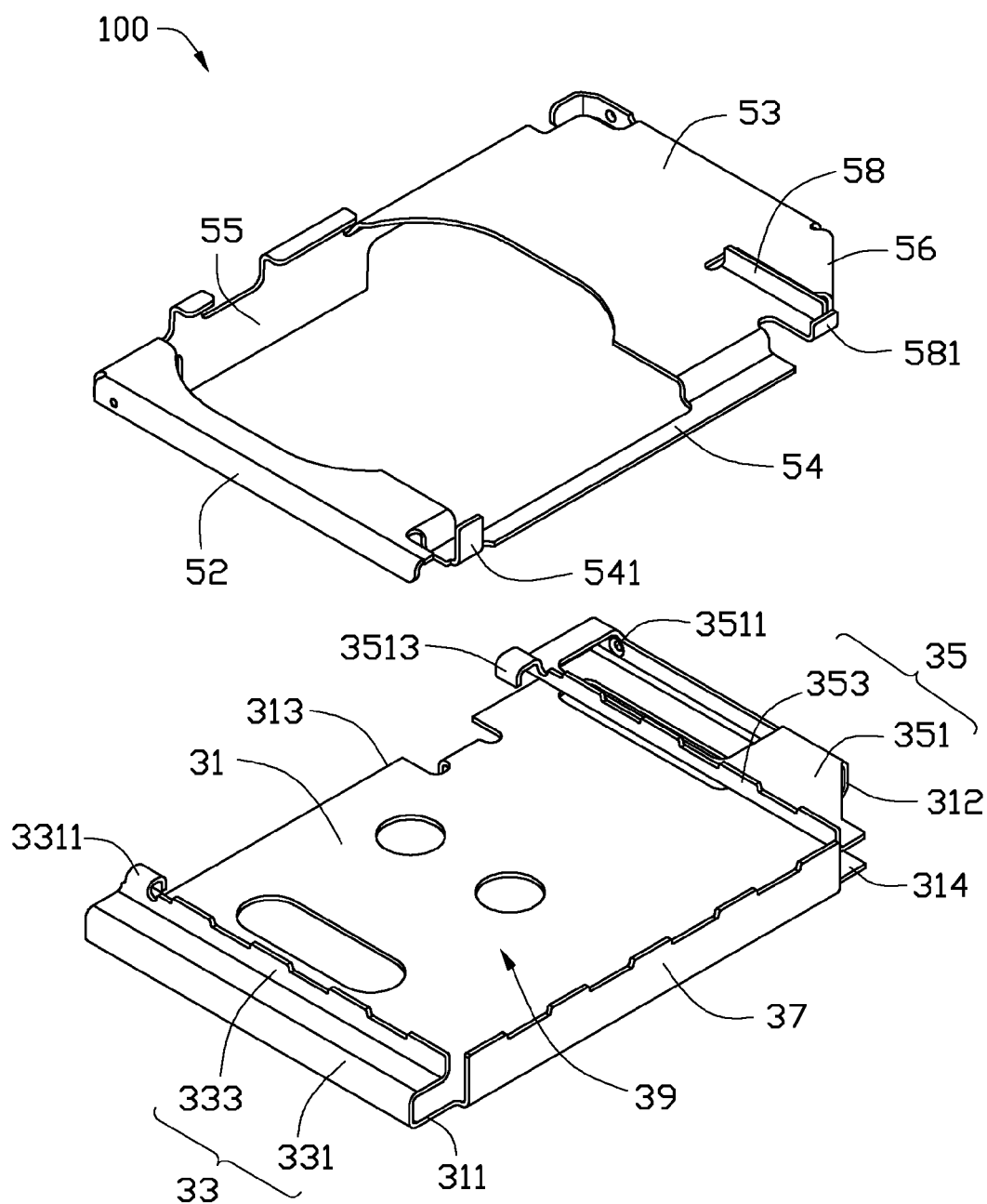
FIG. 2 is an enlarged isometric view of the mounting frame and the holding member shown in FIG. 1.

Referring further to FIG. 2, the mounting frame 30 can be a metal enclosure including an enclosure wall 31, a first securing portion 33, a second securing portion 35 and a side portion 37. The first securing portion 33, the second securing portion 35, and the side portion 37 are positioned at the same side of the enclosure wall 31. The first securing portion 33 and the second securing portion 35 are substantially parallel. The side portion 37 is located between and connects the first securing portion 33 and the second securing portion 35. The first securing portion 33, the second securing portion 35, the side portion 37, and the enclosure wall 31 cooperatively define a mounting cavity 39 with an opening 38 facing the side portion 37.

The first securing portion 33 includes a substantially L-shaped first bent portion 331 and first resisting portion 333. The first bent portion 331 protrudes from a side flange of the enclosure wall 31. The first resisting portion 333 and a hooked first limiting portion 3311 connect the distal end of the first bent portion 331 relative to the enclosure wall 31. The first limiting portion 3311 abuts against the first resisting portion 333.

The second securing portion 35 has a similar structure as the first securing portion 33. The second securing portion 35 and the first securing portion 33 are oppositely arranged at the same side of the enclosure wall 31. The second securing portion 35 includes a substantially L-shaped second bent portion 351 and a second resisting portion 353. The second securing portion 35 is substantially parallel to the first securing portion 33. The second bent portion 351 defines a lateral securing groove 3511 towards the first bending portion 331. The second resisting portion 353 and the second limiting portion 3513 connect the distal end of the second bent portion 351 relative to the enclosure wall 31. The second limiting portion 3513 abuts the second resisting portion 353.

Referring back to FIG. 1, the holding member 50 is generally an enclosure for holding the chip card 60. The holding member 50 includes a supporting wall 51, a guiding rail 52, a positioning portion 53, a limiting section 54, a manipulation portion 55, and an abutting portion 56. The guiding rail 52, the positioning portion 53, the limiting section 54, the manipulation portion 55 and the abutting portion 56 connect with the same side of the supporting wall 51. The guiding rail 52 is parallel to the positioning portion 53. The limiting section 54 is parallel to the manipulation portion 55. The abutting portion 56 is positioned between the positioning portion 53 and the limiting section 54. The guiding rail 52, the positioning portion 53, the limiting section 54, the manipulation portion 55, the abutting portion 56 and the supporting wall 51 cooperatively define a holding cavity 57 for holding the chip card 60.

The supporting wall 51 defines a through hole 511. The connector pins 115 can pass through the through hole 511 to extend into the holding cavity 57 for electronically connecting to the electrical terminals of the chip card 60. Referring further to FIG. 2, the supporting wall 51 has an aligning portion 58 and a blocking portion 581 near the aligning portion 58. The aligning portion 58 is located parallel to the guiding rail 52. The blocking portion 581 is aligned substantially perpendicular to the aligning portion 58.

The positioning portion 53 includes a substantially L-shaped elastic piece 531 opposite to the abutting portion 56. The elastic piece 531 has a projection 533 projecting from the surface thereof. The projection 533 is engagable into the securing groove 3511. The limiting section 54 is generally L-shaped and connects the flange of the holding member 50 opposite to the manipulation portion 55. The limiting section 54 extends a resisting section 541 on the same side of the supporting wall 51 with the aligning portion 58. The resisting section 541 is located adjacent to the guiding rail 52 and perpendicular to the supporting wall 51. The resisting section 541 and the blocking portion 581 cooperatively function to prevent the removal of the holding member 50 relative to the mounting frame 30. The manipulation portion 55 forms a manipulation section 551 for an easy manipulation of the manipulation portion 55.

Figure 4:
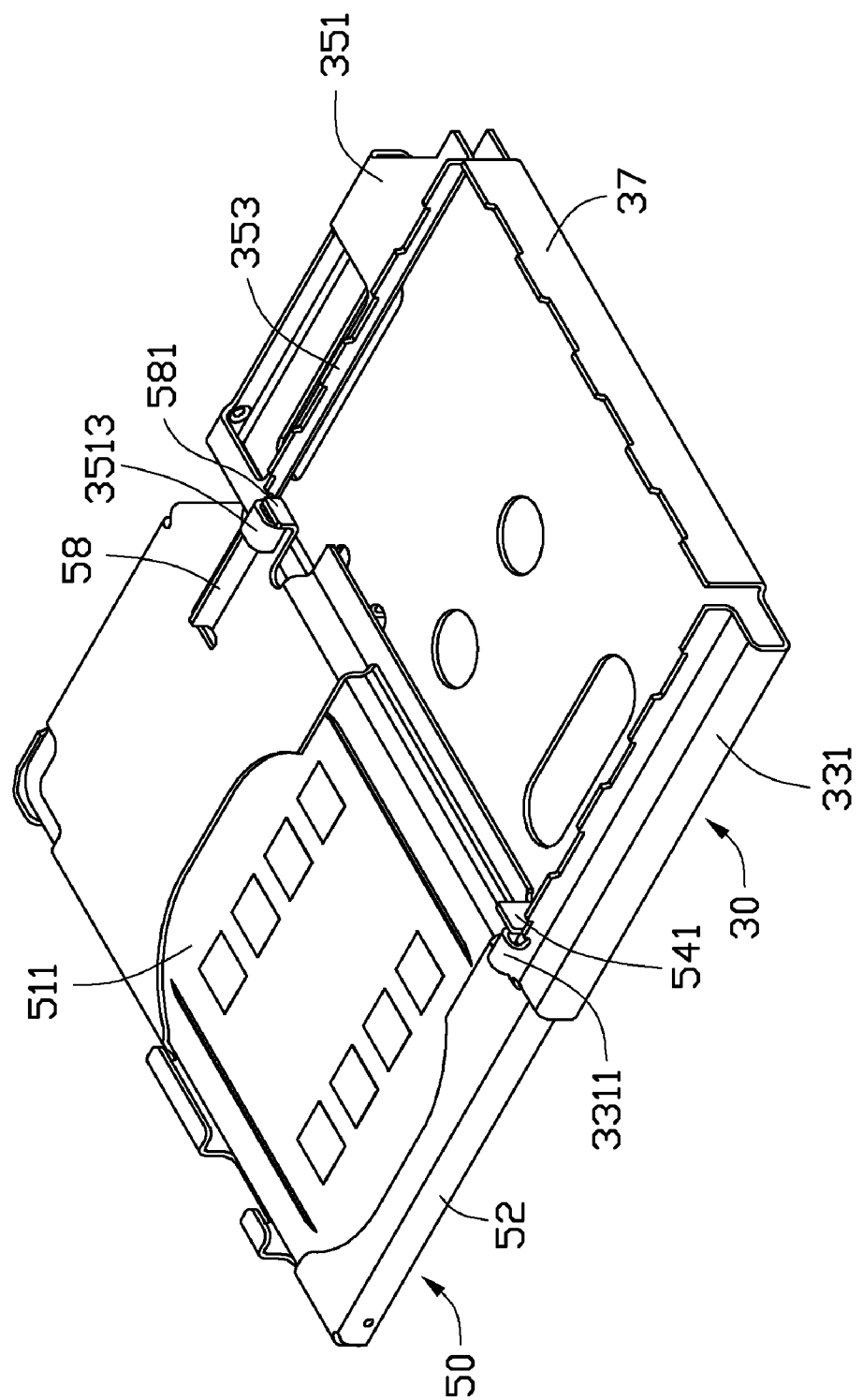
FIG. 4 is another assembled view of the chip card holder in the open position shown in FIG. 3.
Figure 5:
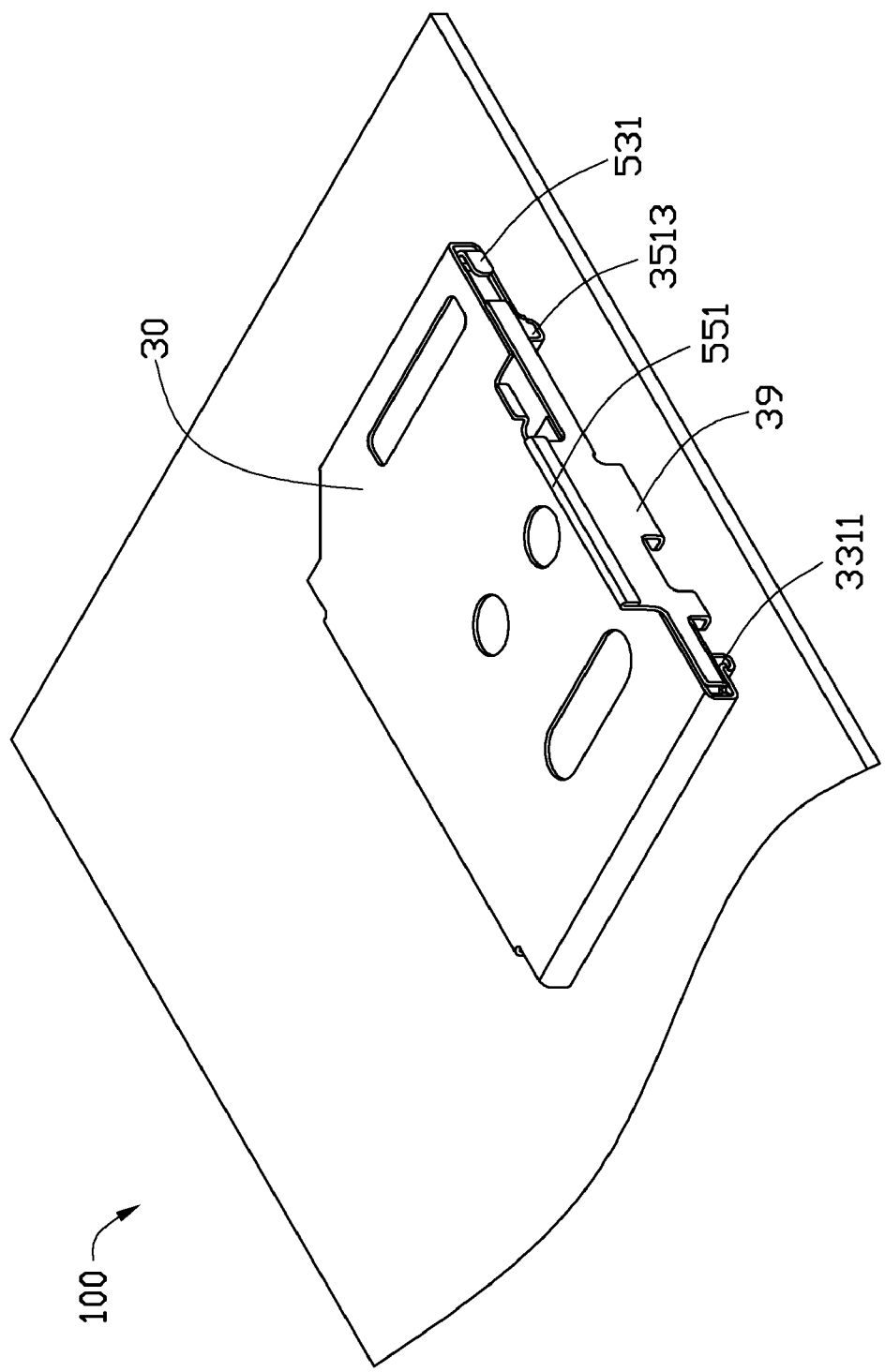
FIG. 5 is another assembled view of the chip card holder shown in FIG. 3 in a closed position.

Referring further to FIGS. 3 through 5 during assembly, the resisting section 541 and the blocking portion 581 are slightly deformed to pass through the opening 38 over the second limiting portion 3513 and the first limiting portion 3311 into the mounting cavity 39. The holding member 50 contacts the first securing portion 33 and the second securing portion 35. The guiding rail 52 slidably engages with the first bent portion 331, and the aligning portion 58 is aligned and is guided by the second resisting portion 353. The holding member 50 can be completely received in the mounting cavity 39 (shown in FIG. 5 when the chip card holder is maintained in a closed position). In this case, the manipulation portion 55 closes the opening 37 and the holding cavity 57 communicates with the mounting cavity 39. The mounting frame 30 in combination with the holding member 50 are secured to the base member 10 with the connector 11 exposed through the through hole 511. Accordingly, the assembly of the chip card holder 100 is finished.

To install the chip card 60 into the chip card holder 100, the chip card holder 100 is transferred between the closed position and the open position. During this process, a pulling force draws the holding member 50 away from the mounting frame 30 to operate the manipulation section 551. The guiding rail 52 and the aligning portion 58 slide along the first bent portion 331 and the second resisting portion 353 respectively. When the holding cavity 57 is completely exposed from the mounting frame 30, the first limiting portion 3311 resists with the resisting section 541, and the blocking portion 581 resists with the second limiting portion 3513. The two resisting actions, as mentioned above, limit further movement of the holding member 50 relative to the mounting frame 30.

Then, the chip card 60 is mounted within the holding cavity 57 with the corner portion 61 abutting the abutting portion 56. A pressing force manipulates the manipulation section 551 again. The holding member 50 slides into the mounting frame 30 with a reverse movement relative to the drawing movement described above, until the holding member 50 is completely received in the mounting cavity 39. At this time, the limiting section 54 abuts against the side portion 37. The chip card 60 resists against and electronically connects with the deformed connector pins 115. The projection 533 secures into the securing groove 3511, maintaining the closed position of the chip card holder 100. At this stage, the holding member 50 is completely received in the mounting frame 30, the mounting frame 30 and the base member 10 cooperatively enclose and prevent the chip card 60 from electromagnetic interference.

It is to be understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A chip card holder for holding a chip card, comprising:
   a base member;
   a metallic mounting frame secured to the base member, the mounting frame including an enclosure wall, an opening and a side portion opposite to the opening, a first securing portion and an opposite second securing portion, the first securing portion, the second securing portion and the side portion connecting with and positioned on the same side of the enclosure wall; and the opening defined by the first securing portion, the second securing portion and the enclosure wall; and
   a holding member for holding the chip card and slidably mounted for movement into and out of the mounting frame;
   wherein when the holding member is completely received in the mounting frame, the mounting frame and the base member cooperatively enclose the chip card and preventing the chip card from electromagnetic interference.

2. The chip card holder as claimed in claim 1, wherein the holding member comprises a manipulation portion on the flange thereof, the manipulation portion for closing the opening when the holding member completely received in the mounting frame.

3. The chip card holder as claimed in claim 2, wherein:
   the second securing portion comprises a resisting portion;
   the holding member comprises a guiding rail and an aligning portion, the guiding rail slidably engaging the first securing portion, and the aligning portion slidably engaging the resisting portion.

4. The chip card holder as claimed in claim 2, wherein:
   the holding member further comprises an elastic piece;
   the elastic piece has a projection projecting therefrom, the second securing portion defines a securing groove, the projection securing in the securing groove when the elastic piece is elastically deformed.

5. The chip card holder as claimed in claim 4, wherein the elastic piece is positioned on the holding member and adjacent to the manipulation portion.

6. The chip card holder as claimed in claim 1, wherein:
   the first securing portion and the second securing portion comprises a first limiting portion and a second limiting portion, respectively;
   the holding member comprises a resisting section and a blocking portion;
   the resisting section and the blocking portion for resisting against the first limiting portion and the second limiting portion respectively for limiting the movement distance of the holding member relative to the mounting frame.

7. The chip card holder as claimed in claim 6, wherein the resisting section and the blocking portion align with each other, and the first limiting portion and the second limiting portion align with each other.

8. A chip card holder for holding a chip card, comprising:
   a base member;
   a mounting frame secured to the base member, the mounting frame including an enclosure wall, an opening and a side portion opposite to the opening, a first securing portion and an opposite second securing portion; the first securing portion, the second securing portion and the side portion connecting with and positioned on the same side of the enclosure wall; and the opening defined by the first securing portion, the second securing portion and the enclosure wall; and
   a holding member for holding the chip card and slidably mounted for movement into and out of the mounting frame;
   wherein the chip card holder operates between an open position and a closed position by sliding of the holding member relative to the mounting frame;
   in the open position, the holding member is are exposed for allowing installation of the chip card; and
   in the closed position, the holding member is completely secured inside the mounting frame, the mounting frame and the base member cooperatively envelop and protecting the chip card from electromagnetic interference.

9. The chip card holder as claimed in claim 8, wherein the holding member comprises a manipulation portion on the flange thereof, the manipulation portion for closing the opening when the holding member completely received in the mounting frame.

10. The chip card holder as claimed in claim 9, wherein:
the second securing portion comprises a resisting portion;
the holding member comprises a guiding rail and an aligning portion, the guiding rail slidably engaging the first securing portion, and the aligning portion slidably engaging the resisting portion.

11. The chip card holder as claimed in claim 9, wherein:
the holding member further comprises an elastic piece;
the elastic piece has a projection projecting therefrom, the second securing portion defines a securing groove, the projection securing in the securing groove when the elastic piece is elastically deformed.

12. The chip card holder as claimed in claim 11, wherein the elastic piece is positioned on the holding member and adjacent to the manipulation portion.

13. The chip card holder as claimed in claim 8, wherein:
the first securing portion and the second securing portion comprises a first limiting portion and a second limiting portion, respectively;
the holding member comprises a resisting section and a blocking portion;
the resisting section and the blocking portion for resisting against the first limiting portion and the second limiting portion respectively for limiting the movement distance of the holding member relative to the mounting frame.

14. The chip card holder as claimed in claim 13, wherein the resisting section and the blocking portion align with each other, and the first limiting portion and the second limiting portion align with each other.

* * * * *